United States Patent

Chou

[19]

[11] Patent Number: 5,933,943
[45] Date of Patent: Aug. 10, 1999

[54] PIN LEADING DEVICE

[76] Inventor: Shu-Chun Yu Chou, 24, Nong 96, Lane 158, Cheng Kong Rd., Hou Li, Taichung, Taiwan

[21] Appl. No.: 08/897,521

[22] Filed: Jul. 21, 1997

[51] Int. Cl.[6] .................................................. B23P 19/00
[52] U.S. Cl. ............................................. 29/741; 140/147
[58] Field of Search ..................... 29/741, 738; 140/123, 140/106

[56] References Cited

U.S. PATENT DOCUMENTS 3,267,716  8/1966  Hales ......................................... 72/384
4,172,317  10/1979  Kober et al. .............................. 29/741

FOREIGN PATENT DOCUMENTS 62-97734  5/1987  Japan ..................................... 140/106

*Primary Examiner*—Steven L. Stephan
*Assistant Examiner*—Jean F. Duverne
*Attorney, Agent, or Firm*—Alan Kamrath

[57] ABSTRACT

A pin leading device (1) comprises a hollow plate holder (8) having a hollow frame (9) and a hollow cylinder (10) disposed on the hollow frame (9), a threaded hole (101) formed in the hollow cylinder (10), a sleeve (2) having a recess hole (21) and a threaded end (20) engaging with the threaded hole (101), an elastic spring (3) inserted in an upper portion of the sleeve (2), a rod (4) inserted in the recess hole (21) and surrounded by the elastic spring (3), and a press head (5) disposed on an upper end of the rod (4). The hollow frame (9) has two opposite lateral plates (90) defining a spacing on a bottom of the hollow frame (9). A pin leading plate (6) is disposed on the bottom of the hollow frame (9). The pin leading plate (6) has a center hole (60) and two serrated lateral sides (7). The spacings between the lateral plates (90) of the hollow frame (9) and the lateral sides (7) of the leading plate (6) receive two rows of pins of an integrated circuit component. When the press head (5) is pressed downward, the pins are bent.

2 Claims, 3 Drawing Sheets

PIN LEADING DEVICE

BACKGROUND OF THE INVENTION

The present invention relates to a pin leading device. More particularly, the present invention relates to a pin leading device for leading the pins of an integrated circuit component.

A conventional pin leading device has a pin leading plate. The size of the pin leading plate is unique in an assembly line. Once the pin leading plate is fixed in the assembly line, it is cumbersome to replace the original pin leading plate with a new pin leading plate. However, there are many types of integrated circuit components with various sizes. Therefore, the user should use many kinds of conventional pin leading devices for leading the pins of various integrated circuit components.

SUMMARY OF THE INVENTION

An object of the present invention is to provide a pin leading device for leading the pins of an integrated circuit component.

Another object of the present invention is to provide a pin leading plate which can be replaced easily.

Another object of the present invention is to provide a hollow plate holder which can be replaced easily.

Accordingly, a pin leading device comprises a hollow plate holder having a hollow frame and a hollow cylinder disposed on the hollow frame, a threaded hole formed in the hollow cylinder, a sleeve having a recess hole and a threaded end engaging with the threaded hole, an elastic element inserted in an upper portion of the sleeve, a rod insetted in the recess hole and surrounded by the elastic element, and a press head disposed on an upper end of the rod. The hollow frame has two opposite lateral plates defining a spacing on a bottom of the hollow frame. A pin leading plate is disposed on the bottom of the hollow frame. The pin leading plate has a center hole and two serrated lateral sides. The spacing between the hollow frame and the pin leading plate receiving two rows of pins of an integrated circuit component. When the press head is pressed downward, the pins are bent.

DETAILED DESCRIPTION OF THE INVENTION

Figure 1:
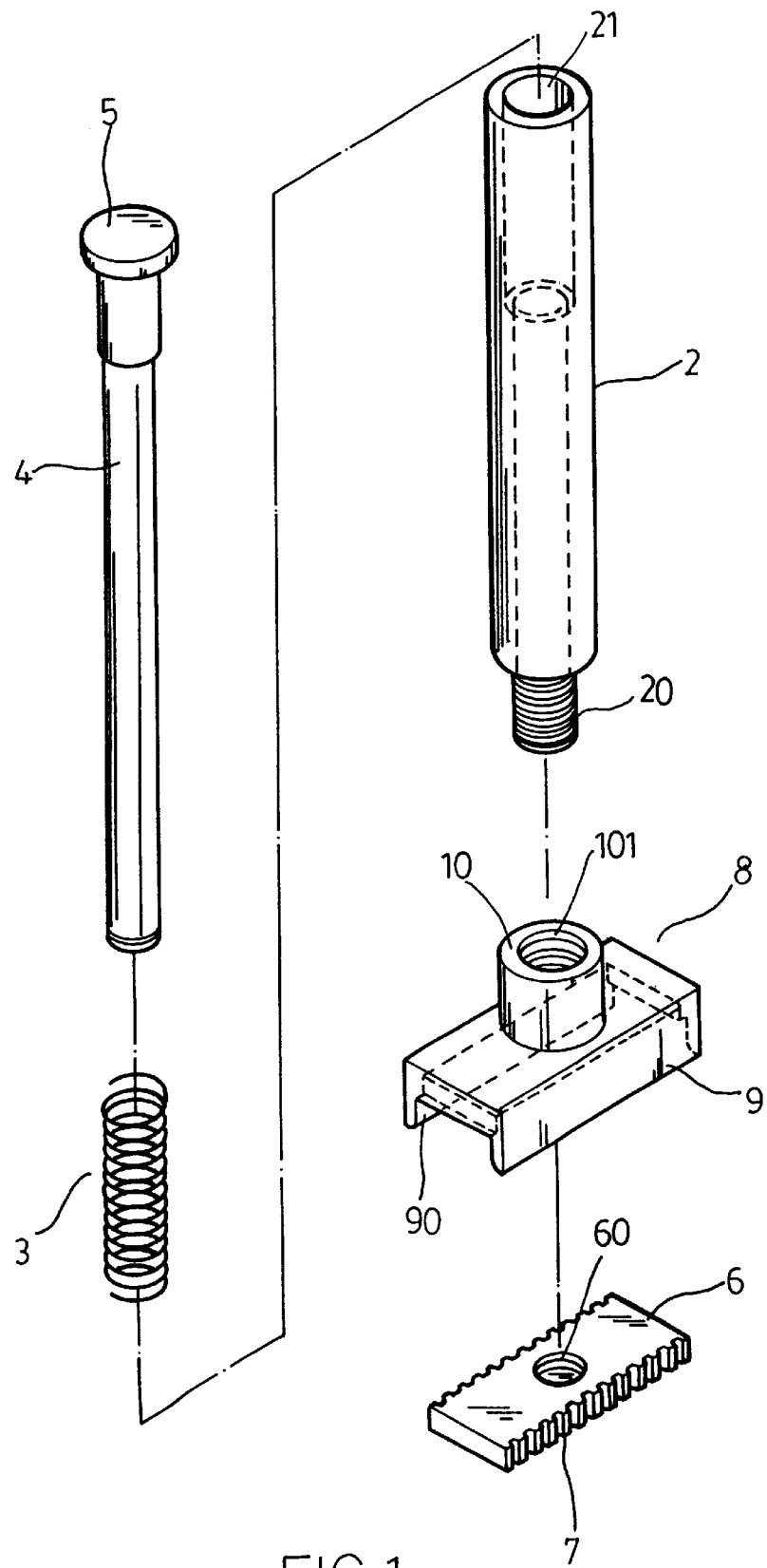
FIG. 1 is a perspective exploded view of a pin leading device of a first preferred embodiment in accordance with the present invention.
Figure 2:
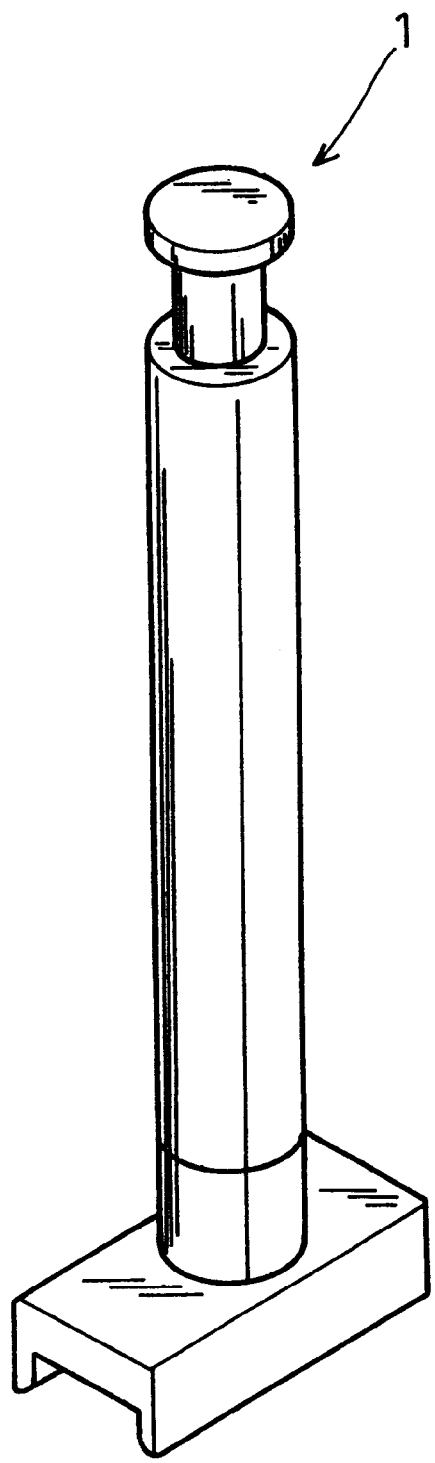
FIG. 2 is a perspective assembly view of a pin leading device of a first preferred embodiment in accordance with the present invention.

Referring to FIGS. 1 and 2, a pin leading device 1 comprises a hollow plate holder 8 having a hollow frame 9 and a hollow cylinder 10 disposed on the hollow frame 9, a threaded hole 101 formed in the hollow cylinder 10, a sleeve 2 having a recess hole 21 and a threaded end 20 engaging with the threaded hole 101, an elastic spring 3 inserted in an upper portion of the sleeve 2, a rod 4 inserted in the recess hole 21 and surrounded by the elastic spring 3, and a press head 5 disposed on an upper end of the rod 4. The hollow frame 9 has two opposite lateral plates 90 defining a spacing on a bottom of the hollow frame 9. A pin leading plate 6 is disposed on the bottom of the hollow frame 9. The pin leading elate 6 has a center hole 60 and two serrated lateral sides 7. The center hole 60 threadably receives the lower threaded end of the rod 4.

The spacing between the hollow frame 9 and the pin leading plate 6 receiving two rows of pins of an integrated circuit component. When the press head 5 is pressed downward, the pins are bent.

Figure 3:
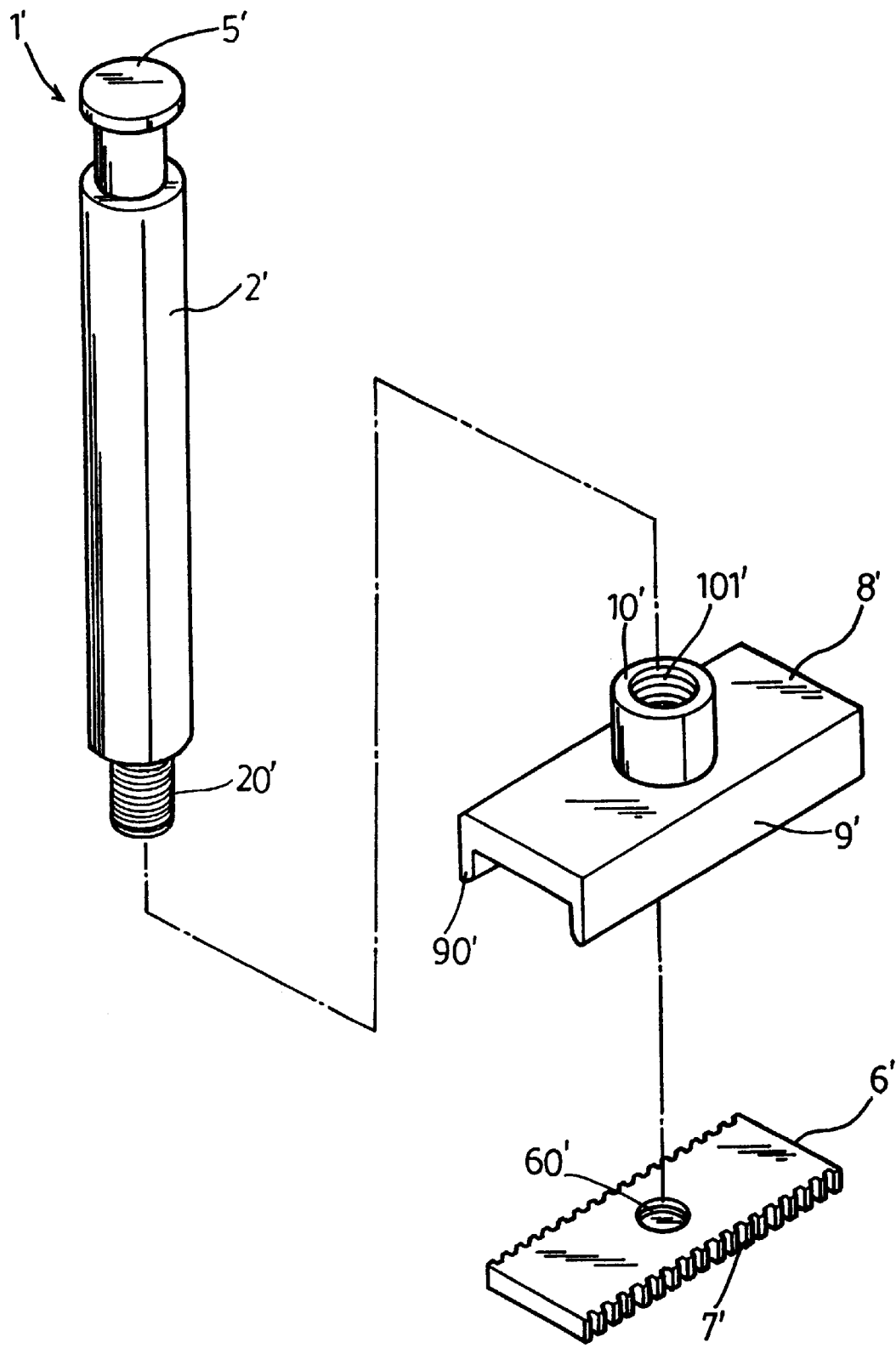
FIG. 3 is a perspective exploded view of another pin leading device of a second preferred embodiment in accordance with the present invention.

Referring to FIG. 3, another pin leading device 1' comprises a hollow plate holder 8' having an enlarged frame 9' and a hollow cylinder 10' disposed on the enlarged frame 9', a threaded hole 101' formed in the hollow cylinder 10', a sleeve 2' having a recess hole (not shown in the figure) and a threaded end 20' engaging with the threaded hole 101', an elastic spring (not shown in the figure) inserted in an upper portion of the sleeve 2', a rod (not shown in the figure) inserted in the recess hole and surrounded by the elastic spring, and a press head 5' disposed on an upper end of the rod. The enlarged frame 9' has two opposite lateral plates 90' defining a spacing on a bottom of the enlarged frame 9'. An enlarged pin leading plate 6' is disposed on the bottom of the hollow frame 9'. The pin leading plate 6' has a center hole 60' and two serrated lateral sides 7'. The center hole 60' threadably receives the lower threaded end of the rod (not shown in the figure).

When the enlarged pin leading plate 6' is broken, the user can replace the enlarged pin leading plate 6' only. Therefore, the whole pin leading device 1' need be replaced.

When the sizes of the integrated circuit components are varied, the user can replace the hollow plate holder 8' and the enlarged pin leading plate 6'. Therefore, the original rod and the original sleeve can be used again.

The present invention has the following advantages. The pin leading plate can be replaced easily while the pin leading plate is broken. Furthermore, the hollow plate holder can be replaced easily while the size of the integrated circuit component is changed. The pin leading plate can be replaced easily while the size of the integrated circuit component is changed.

The invention is not limited to the above embodiment but various modification thereof may be made. Further, various changes in form and detail may be made without departing from the scope of the invention.

I claim:

1. A pin leading device comprising, in combination:

a hollow plate holder having a hollow frame and a hollow cylinder disposed on the hollow frame, wherein the hollow frame has two opposite lateral plates defining a fixed spacing;

a threaded hole formed in the hollow cylinder;

a sleeve having a recess hole and a threaded end engaging with the threaded hole;

an elastic element inserted in an upper portion of the sleeve;

a rod inserted in the recess hole and surrounded by the elastic element, with the rod having a threaded lower end;

a pin leading plate disposed on a bottom of the hollow frame, and the pin leading plate having a center hole for receipt of the threaded lower end of the rod and two serrated lateral sides, with the two opposite lateral plates and the two serrated lateral sides adapted to receive two rows of pins of an integrated circuit component.

2. A pin leading device as claimed in claim 1, wherein the elastic element is a spring.

* * * * *